United States Patent
Sakaguchi

(10) Patent No.: US 10,199,779 B2
(45) Date of Patent: Feb. 5, 2019

(54) SHIELD CONNECTOR

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Kiyokazu Sakaguchi, Mie (JP)

(73) Assignees: AutoNetworks Technologies, Ltd. (JP); Sumitomo Wiring Systems, Ltd. (JP); Sumitomo Electric Industries, Ltd. (JP)

(*) Notice: Subject to any disclaimer, the term of this patent is extended or adjusted under 35 U.S.C. 154(b) by 0 days.

(21) Appl. No.: 15/759,286

(22) PCT Filed: Sep. 7, 2016

(86) PCT No.: PCT/JP2016/076298
§ 371 (c)(1),
(2) Date: Mar. 12, 2018

(87) PCT Pub. No.: WO2017/047468
PCT Pub. Date: Mar. 23, 2017

(65) Prior Publication Data
US 2018/0277982 A1 Sep. 27, 2018

(30) Foreign Application Priority Data
Sep. 14, 2015 (JP) .................................. 2015-180489

(51) Int. Cl.
*H01R 13/659* (2011.01)
*H01R 13/6592* (2011.01)
(Continued)

(52) U.S. Cl.
CPC ..... *H01R 13/6592* (2013.01); *H01R 13/5202* (2013.01); *H01R 13/5205* (2013.01);
(Continued)

(58) Field of Classification Search
CPC .................................................. H01R 13/6592
See application file for complete search history.

(56) References Cited

U.S. PATENT DOCUMENTS 5,886,294 A * 3/1999 Scrimpshire ......... G02B 6/3887
174/359
2011/0004501 A1 1/2011 Pradhan et al.
(Continued)

FOREIGN PATENT DOCUMENTS

JP 3-86577 9/1991
JP 2010-282925 12/2010
(Continued)

OTHER PUBLICATIONS

International Search Report dated Nov. 29, 2016.

*Primary Examiner* — James Harvey
(74) *Attorney, Agent, or Firm* — Gerald E. Hespos; Michael J. Porco; Matthew T. Hespos

(57) ABSTRACT

A shield connector (1) includes wires (W) extending out from a housing (8) through a tube (11). A braided wire (12) surrounds the wires (W). An end part of the braided wire (12) on the side of a housing body is mounted on the tube (11). A rubber boot (13) covers the tube (11) and parts of the wires (W) extending out from the tube (11) from above the braided wire (12), and a shield shell (17) covers the housing body (9) and part of the boot (13) covers the tube (11). The rubber boot (13) is fixed to the shield shell (17). An end part of the braided wire (12) on the side of the housing body (9) extends out from an opening of the rubber boot (13) on the
(Continued)

side of the housing body (9) and is sandwiched between the rubber boot (13) and the shield shell (17).

3 Claims, 4 Drawing Sheets

(51) Int. Cl.
    *H01R 13/52*     (2006.01)
    *H01R 13/648*     (2006.01)
    *H05K 9/00*     (2006.01)

(52) U.S. Cl.
    CPC ....... *H01R 13/5213* (2013.01); *H01R 13/648* (2013.01); *H05K 9/0098* (2013.01)

(56) References Cited

U.S. PATENT DOCUMENTS

| | | | |
|---|---|---|---|
| 2011/0045701 A1 | 2/2011 | Tsuruta | |
| 2012/0270444 A1 | 10/2012 | Kawamura | |
| 2013/0260585 A1* | 10/2013 | Wang | H01R 13/5202 439/271 |
| 2015/0303611 A1 | 10/2015 | Iizuka | |
| 2016/0181735 A1 | 6/2016 | Higashi et al. | |

FOREIGN PATENT DOCUMENTS

| | | |
|---|---|---|
| JP | 2011-44354 | 3/2011 |
| JP | 2012-226948 | 11/2012 |
| JP | 2014-22043 | 2/2014 |
| JP | 2014-99339 | 5/2014 |

\* cited by examiner

SHIELD CONNECTOR

BACKGROUND

Field of the Invention

This specification relates to a shield connector.

Description of the Related Art

Japanese Unexamined Patent Publication No. 2012-226948 discloses a shield connector with a wire extending out through a tubular portion from the inside of a housing. A shield conductor surrounds the wire and a shield shell covers the outer periphery of the tubular portion. A structure also is provided for electrically connecting the shield conductor and the shield shell and a structure for sealing between the tubular portion and the shield shell in a watertight manner.

The shield connector described in Japanese Unexamined Patent Publication No. 2012-226948 has a connector housing composed of a large diameter portion and a small diameter portion (equivalent to the tubular portion). A shield shell is provided with a tubular shell body for covering the outer periphery of the small diameter portion. A front part of a substantially tubular braided wire (equivalent to the shield conductor) having a wire inserted inside is mounted on the shell body, and the braided wire and the shell body are connected electrically by caulking the mounted front part by a caulking ring made of metal. Further, a first rubber ring is fit on the small diameter portion of the shield connector described in Japanese Unexamined Patent Publication No. 2012-226948 and watertight sealing is provided between the small diameter portion and the shell body by the first rubber ring.

Further, the shield connector described in Japanese Unexamined Patent Publication No. 2012-226948 includes a first rubber boot for protecting the wire from water, external matter and the like. The first rubber boot is mounted on the shell body from above the braided wire, and caulked and fixed by a fastening band to prevent the penetration of water through a clearance between the first rubber boot and the shell body.

However, according to the shield connector described in Japanese Unexamined Patent Publication No. 2012-226948, the caulking ring is necessary to electrically connect the braided wire and the shield shell and the first rubber boot is necessary to seal between the small diameter portion and the shell body in a watertight manner. Thus, the number of components of the connector increases. If the number of components of the connector increases, there is a problem that the connector is enlarged.

This specification relates to a structure for electrically connecting a shield conductor and a shield shell and a structure for sealing between a tubular portion and the shield shell in a waterproof manner by a small number of components, thereby miniaturizing a connector.

SUMMARY

A shield connector disclosed in this specification includes a housing having a housing body. A fitting is provided on the housing and is configured to be fit into a mounting hole provided in a case of a device and a tubular portion extends out from the housing body. A wire extends out from the inside of the housing through the tubular portion, and a shield conductor surrounds the wire. An end part of the shield conductor on the housing body side is mounted on the tubular portion, and a tubular rubber boot covers the tubular portion and a part of the wire extending out from the tubular portion from above the shield conductor. A shield shell covers the housing body and a part of the rubber boot covering the tubular portion. The rubber boot is fastened and fixed to the shield shell. An end part of the shield conductor on the housing body side extends out from an opening of the rubber boot on the housing body side and is sandwiched between the rubber boot and the shield shell.

Accordingly, the folded part of the shield conductor is sandwiched between the rubber boot and the shield shell. In other words, the folded part of the shield conductor is pressed against the shield shell by a resilient force of the rubber boot. Thus, the shield conductor and the shield shell can be electrically connected without using a component such as the caulking ring described in Japanese Unexamined Patent Publication No. 2012-226948.

Further, the rubber boot interposed between the tubular portion and the shield shell also functions as a rubber ring. Thus, watertight sealing can be provided between the tubular portion and the shield shell without using a component such as the first rubber ring described in Japanese Unexamined Patent Publication No. 2012-226948.

As described above, a structure for electrically connecting the shield conductor and the shield shell and a structure for sealing between the tubular portion and the shield shell in a watertight manner can be realized by a smaller number of components, utilizing the resilient force of the rubber boot, as compared to the case where the caulking ring and the first rubber ring of Japanese Unexamined Patent Publication No. 2012-226948 are used. In this way, the shield connector can be miniaturized.

The shield shell may include a shell body for covering the housing body and a part of the rubber boot, and a fastening portion may be arranged on a side opposite to the shell body across the rubber boot. The fastening portion fastens the rubber boot in cooperation with the shell body from above a folded part of the shield conductor.

According to the above-described shield connector, contact between the shield conductor and the shield shell can be made more reliable and sealability between the tubular portion and the shield shell can be improved.

Note that if the shield shell is divided into the shell body and the fastening portion, the number of components increases. However, the shield connector described in Japanese Unexamined Patent Publication No. 2012-226948 also includes the fastening band for fastening the first rubber boot. The fastening portion and the fastening band cancel out each other in terms of the number of components. Thus, even if the shield shell is divided into the shell body and the fastening portion, the above-described shield connector has a smaller number of components at least by the caulking ring and the first rubber ring described in Japanese Unexamined Patent Publication No. 2012-226948.

Further, either one of the rubber boot and the shield shell may have a projection extending in a circumferential direction of the rubber boot formed on a surface in contact with the other, and the other may be formed with a recess in a surface in contact with the one. The projection is fit into the recess.

According to the above-described shield connector, a clearance is less likely to be formed between the rubber boot and the shield shell by fitting the projection into the recess. Thus, sealability between the tubular portion and the shield shell can be improved.

According to the shield connector disclosed in this specification, a structure for electrically connecting the shield conductor and the shield shell and a structure for sealing between the tubular portion and the shield shell in a watertight manner can be realized by a small number of components. In this way, the connector can be miniaturized.

DETAILED DESCRIPTION

An embodiment is described on the basis of FIGS. 1 to 4. In the following description, a vertical direction and a front-rear direction are based on a vertical direction and a front-rear direction shown in FIG. 1. Further, a left side is a back side with respect to the plane of FIG. 1 and a right side is a front side with respect to the plane of FIG. 1.

A shield connector 1 according to this embodiment is a two-pole connector with two positive and negative poles to be mounted into a mounting hole provided in a metal case for accommodating an inverter (an example of a device) installed in a vehicle such as an electric or hybrid vehicle for electrically connecting the inverter and a battery.

Figure 1:
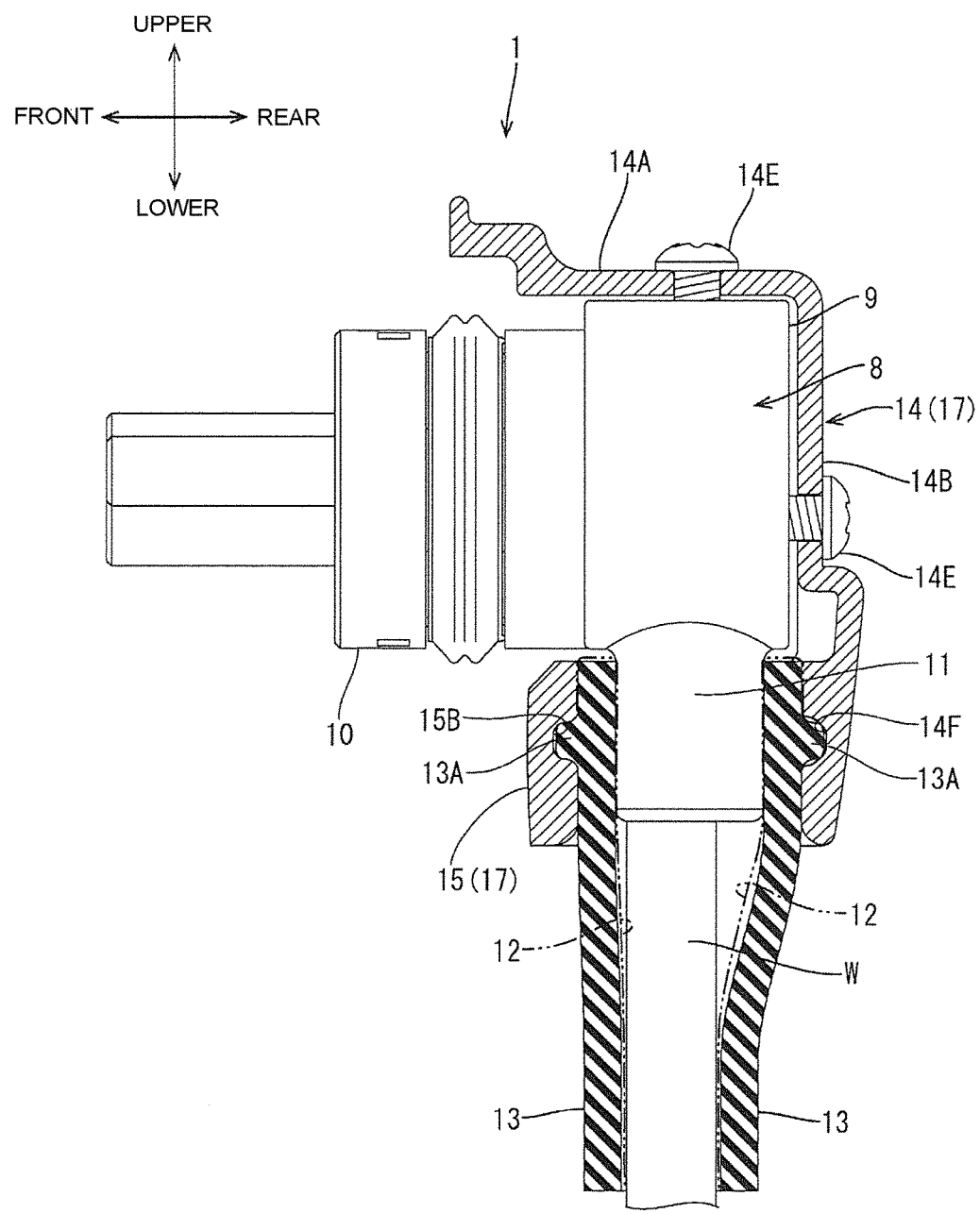
FIG. 1 is a section along A-A of FIG. 4 showing a shield connector according to an embodiment (however, a housing is shown in a side view).

As shown in FIG. 1, the shield connector 1 includes a connector housing 8, two wires W (only one wire is shown in FIG. 1), a braided wire 12 for collectively surrounding parts of the two wires W extending out from a tubular portion 11, a tubular rubber boot 13 and a shield shell 17.

The connector housing 8 includes a housing body 9, a fitting 10 and the tubular portion 11. The fitting 10 is a rectangular tube and protrudes forward from the housing body 9. As described above, the mounting hole is provided in the case of the inverter and the shield connector 1 is mounted on the case of the inverter by fitting and inserting the fitting 10 into that mounting hole. Two unillustrated terminal fittings are accommodated inside the fitting 10 and the wires W are connected to rear end parts of those two terminal fittings directly or via relay terminals inside the housing body 9 or inside the tubular portion 11.

The tubular portion 11 is formed into a tubular shape and extends down from the housing body. The tubular portion 11 is formed into a flat shape long in a lateral direction (direction perpendicular to the plane of FIG. 1) when viewed from a lower side shown in FIG. 1, and the two wires W are pulled out from the inside of the tubular portion 11. Specifically, the tubular portion 11 is provided not for each wire W and the two wires W are pulled out from the inside of one tubular portion 11.

The braided wire 12 has a tubular shape by braiding copper or copper alloy strands and the two wires W can be inserted collectively through the braided wire 12. An end part of the braided wire 12 on the side of the housing body 9 is mounted on the tubular portion 11 with the tubular portion 11 inserted inside.

The rubber boot 13 is for protecting the wires W from water, external matter and the like. The rubber boot 13 is formed into a substantially tubular shape and collectively covers the tubular portion 11 and parts of the respective wires W extending out from the tubular portion 11 (more specifically, parts of the wires W extending out from the tubular portion 11 and near the tubular portion 11) from above the braided wire 12.

As shown in FIG. 1, a part of the rubber boot 13 covering the tubular portion 11 is covered by the shield shell 17. Although not shown in FIG. 1, the part of the rubber boot 13 covering the tubular portion 11 is covered over the entire circumference by the shield shell 17. The rubber boot 13 is fixed to the tubular portion 11 by the part thereof covering the tubular portion 11 fastened by the shield shell 17. Further, a projection 13A extending in a circumferential direction of the rubber boot 13 is provided integrally over the entire circumference on the outer peripheral surface of the part of the rubber boot 13 covering the tubular portion 11.

Figure 2:
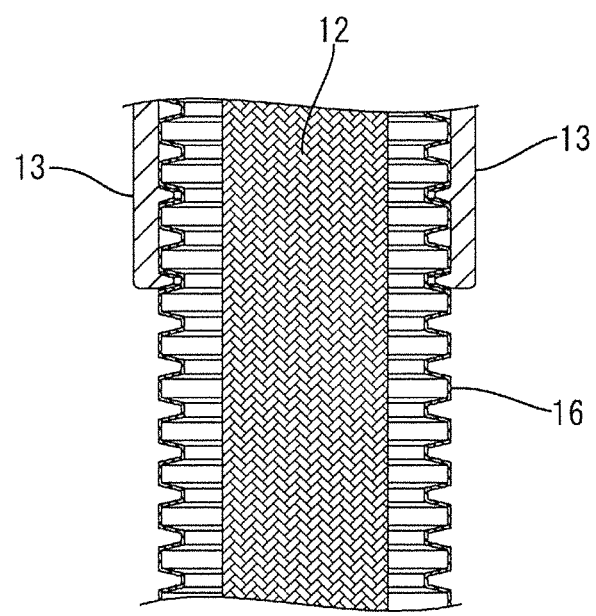
FIG. 2 is a section showing a lower end part of a rubber boot, a corrugated tube connected to the rubber boot and a shield conductor (however, the shield conductor is shown in a side view).

Further, as shown in FIG. 2, a flexible bellows-like corrugated tube 16 is inserted inside an end part of the rubber boot 13 on a side opposite to the housing body 9. Inner peripheral lips are provided on the inner peripheral surface of the end part of the rubber boot 13 on the opposite side, and the penetration of water through a clearance between the rubber boot 13 and the corrugated tube 16 is prevented by the engagement of the inner peripheral lips and projections and recesses of the bellows-like corrugated tube 16.

As shown in FIG. 1, the shield shell 17 includes a shell body 14 and a fastening portion 15. In this embodiment, the shell body 14 and the fastening portion 15 are manufactured by die casting.

The shell body 14 includes an upper wall 14A for covering an upper side of the housing body 9 and a rear wall 14B for covering a rear side of the housing body 9, and those walls are fastened to the housing body 9 by bolts 14E. Further, although not shown in FIG. 1, the shell body 14 also includes a left wall for covering a left side of the housing body 9 and a right wall 14C (see FIG. 3) for covering a right side of the housing body 9.

Further, a lower end part of the shell body 14 covers a part of the outer peripheral surface of the rubber boot 13 (more specifically, a range excluding a range of the outer peripheral surface of the rubber boot 13 covered by the fastening portion 15), and a surface of this lower end part facing toward the rubber boot 13 is pressed in contact with the outer peripheral surface of the rubber boot 13.

As shown in FIG. 1, a recess 14F into which the projection 13A provided on the rubber boot 13 is fit is formed in the surface of this lower end part facing toward the rubber boot 13. A length of the projection 13A in a projecting direction is longer than a depth of the recess 14F and the tip of the projection 13A is pressed in contact with the bottom of the recess 14F.

Figure 3:
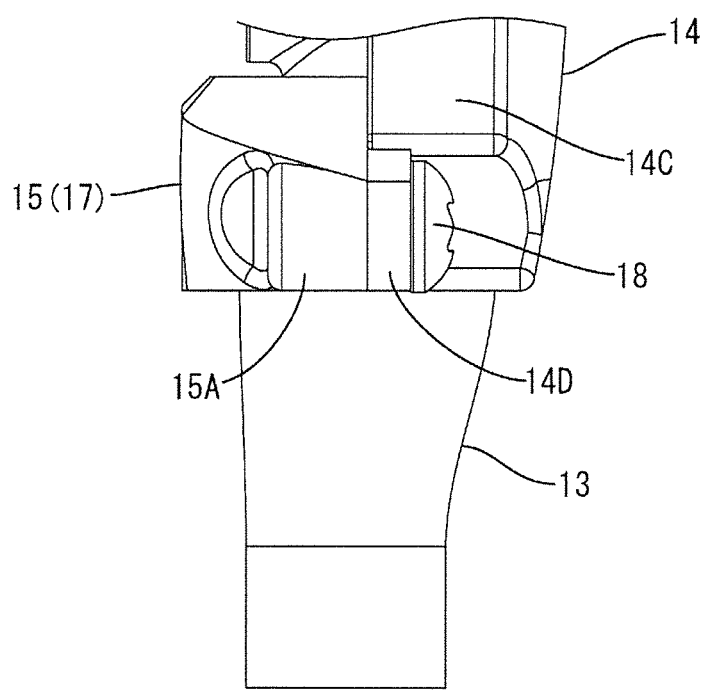
FIG. 3 is a side view of a shield shell and a fastening portion.

Further, as shown in FIG. 3, a fixing portion 14D for fixing the fastening portion 15 to the shell body 14 is provided integrally on a lower end part of the right wall 14C. A fixing portion 14D similarly is provided integrally on a lower end part of the left wall. Each fixing portion 14D is formed with a bolt insertion hole penetrating in the front-rear direction.

Further, as shown in FIG. 1, a front end part of the upper wall 14A is bent up and bolt insertion holes are formed in both left and right end parts of that bent part. The shell body 14 is fixed to the case by inserting bolts into those bolt insertion holes and fastening the bolts to the case of the inverter. In this way, the detachment of the shield connector 1 is prevented and the shell body 14 and the case are connected electrically to secure a shield path.

As shown in FIG. 1, the fastening portion 15 is arranged on a side opposite to the shell body 14 across the rubber boot 13 (in front of the rubber boot 13 in FIG. 1). The fastening portion 15 is for fastening the rubber boot 13 in cooperation with the shell body 14, and a surface thereof facing toward the rubber boot 13 is pressed in contact with the outer peripheral surface of the rubber boot 13.

Figure 4:
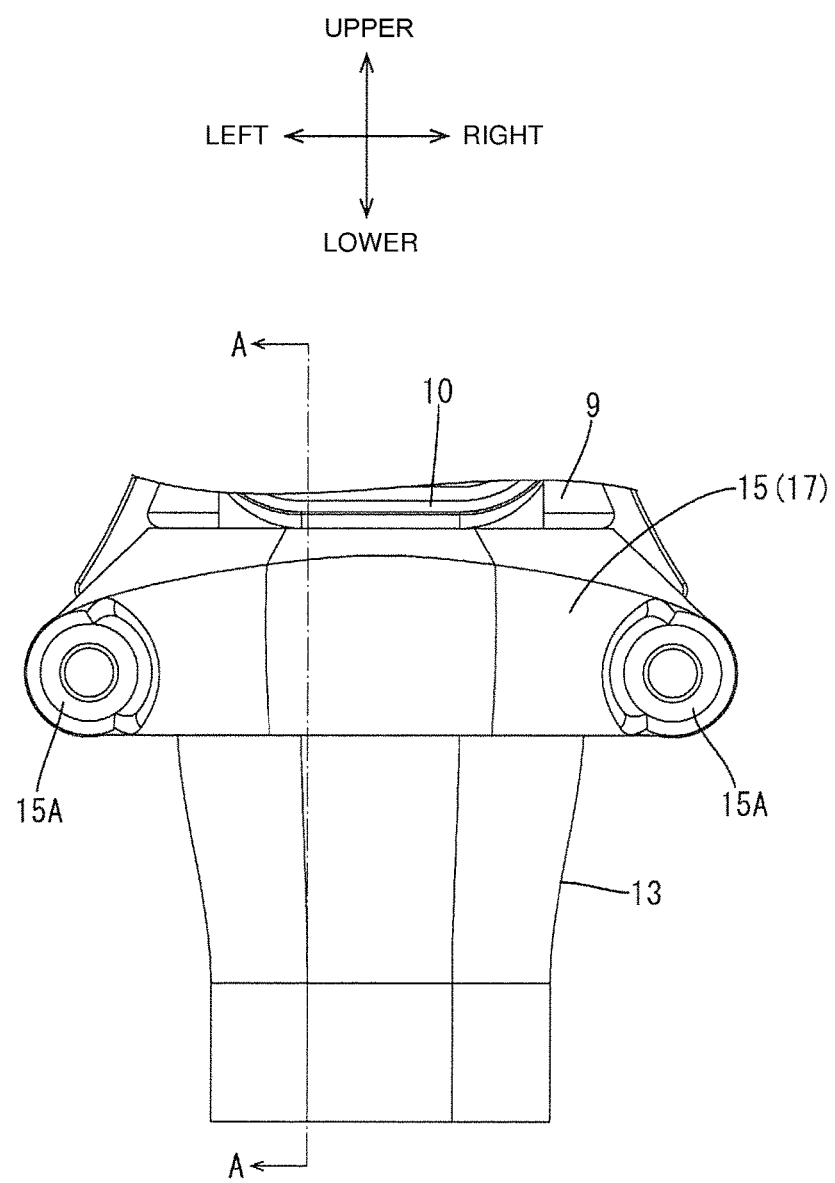
FIG. 4 is a front view of the fastening portion viewed from a front side in a connecting direction.

As shown in FIG. 4, the fastening portion 15 is long in the lateral direction and nuts 15A to which bolts are fastened are provided integrally on both left and right end parts. As shown in FIG. 3, bolts 18 inserted through the fixing portions 14D of the shell body 14 from behind are fastened to the nuts 15A so that the fastening portion 15 is fixed to the shell body 14.

Further, as shown in FIG. 1, the surface of the fastening portion 15 facing toward the rubber boot 13 (surface facing rearward in FIG. 1) is formed with a recess 15B into which the projection 13A is fit. The length of the projection 13A in the projecting direction is longer than a depth of the recess 15B and the tip of the projection 13A is pressed in contact with the bottom of the recess 15B.

As shown in FIG. 1, the braided wire 12 extends up from the rubber boot 13. In other words, the end part of the braided wire 12 on the side of the housing body 9 extends out from an opening of the rubber boot 13 on the side of the housing body 9. That extending part is folded radially out over the entire circumference to cover an edge of the outer peripheral surface of the rubber boot 13.

The fastening portion 15 is fixed to the shell body 14. Thus, the part of the rubber boot 13 covering the tubular portion 11 is fastened from above the folded part of the braided wire 12 (more specifically, part of the braided wire 12 covering the edge of the outer peripheral surface of the rubber boot 13). When the rubber boot 13 is fastened, the folded part of the braided wire 12 is pressed against the shield shell 17 by a resilient force of the rubber boot 13 and sandwiched between the rubber boot 13 and the shield shell 17. In this way, the folded part of the braided wire 12 contacts the shield shell 17 and the braided wire 12 and the shield shell 17 are connected electrically.

When the part of the rubber boot 13 covering the tubular portion 11 is fastened by the shell body 14 and the fastening portion 15, the inner peripheral surface of the rubber boot 13 is pressed in contact with the outer peripheral surface of the tubular portion 11 via the braided wire 12 (more specifically, an unfolded part of the braided wire 12) and the outer peripheral surface of the rubber boot 13 is pressed in contact with the shield shell 17 directly or via the braided wire 12 (more specifically, the part of the braided wire 12 covering the edge of the outer peripheral surface of the rubber boot 13). Thus, the rubber boot 13 interposed between the tubular portion 11 and the shield shell 17 functions as a rubber ring to seal between the tubular portion 11 and the shield shell 17 in a watertight manner.

According to the shield connector 1 described above, the folded part of the braided wire 12 is sandwiched between the rubber boot 13 and the shield shell 17. In other words, the folded part of the braided wire 12 is pressed against the shield shell 17 by the resilient force of the rubber boot 13. Thus, the braided wire 12 and the shield shell 17 can be connected electrically without using a component such as the caulking ring described in Japanese Unexamined Patent Publication No. 2012-226948.

Further, the rubber boot 13 interposed between the tubular portion 11 and the shield shell 17 also functions as a rubber ring. Thus, watertight sealing can be provided between the tubular portion 11 and the shield shell 17 without using a component such as the first rubber ring described in Japanese Unexamined Patent Publication No. 2012-226948.

According to the shield connector 1, the structure for electrically connecting the braided wire 12 and the shield shell 17 and the structure for sealing between the tubular portion 11 and the shield shell 17 in a watertight manner can be realized by a smaller number of components, utilizing the resilient force of the rubber boot 13, as compared to the case where the caulking ring and the first rubber ring of Japanese Unexamined Patent Publication No. 2012-226948 are used.

Furthermore, according to the shield connector 1, the shield shell 17 includes the shell body 14 and the fastening portion 15 and those fasten the part of the rubber boot 13 covering the tubular portion 11 in cooperation from above the folded part of the braided wire 12. Thus, contact between the braided wire 12 and the shield shell 17 can be made more reliable and sealability between the tubular portion 11 and the shield shell 17 can be improved.

Note that if the shield shell 17 is divided into the shell body 14 and the fastening portion 15, the number of components increases. However, since the above shield connector described in Japanese Unexamined Patent Publication No. 2012-226948 also includes the fastening band for fastening the first rubber boot, the fastening portion 15 and the fastening band cancel out each other in terms of the number of components. Thus, even if the shield shell 17 is divided into the shell body portion 14 and the fastening portion 15, the shield connector 1 has a smaller number of components at least by the caulking ring and the first rubber ring described Japanese Unexamined Patent Publication No. 2012-226948.

Furthermore, according to the shield connector 1, the projection 13A formed on the outer peripheral surface of the rubber boot 13 is fit into the recess 14F of the shell body 14 and the recess 15B of the fastening portion 15. Thus, a clearance is less likely to be formed between the rubber boot 13 and the shield shell 17. In this way, sealability between the tubular portion 11 and the shield shell 17 can be improved.

The invention is not limited to the above described embodiment. For example, the following embodiments also are included in the scope of the invention.

A case where the shield shell 18 is composed of two members, i.e. the shell body 14 and the fastening portion 15 has been described as an example in the above embodiment. However, a shield shell may be composed of one member. For example, the shield shell may include a tubular portion formed by integrating the fastening portion 15 with the shell body 14. The rubber boot 13 may be press-fit into that tubular portion.

A case where the rubber boot 13 is formed with the projection 13A and the shield shell 17 is formed with the recess 14F has been described as an example in the above embodiment. However, the rubber boot 13 may be formed with the recess 14F and the shield shell 17 may be formed with the projection 13A.

A case where the end part of the braided wire 12 on the side of the housing body 9 extends outward from the opening of the rubber boot 13 on the side of the housing body 9 over the entire circumference has been described as an example in the above embodiment. However, only a part of the braided wire 12 in the circumferential direction may extend from the rubber boot 13 and only that extending part may be folded.

A case where the two-pole connector with two positive and negative poles for connecting the inventor and the battery has been described as an example of the shield connector in the above embodiment. However, the shield connector may be a three-pole connector for connecting the inverter and a three-phase motor installed in the vehicle.

A case where the shield shell 17 is manufactured by die casting has been described as an example in the above embodiment. However, the shield shell 17 may be manufactured by press-working a metal plate.

LIST OF REFERENCE SIGNS

1 . . . shield connector
8 . . . connector housing
9 . . . housing body
10 . . . fitting portion
11 . . . tubular portion
12 . . . braided wire (example of shield conductor)
13 . . . rubber boot
13A . . . projection
14 . . . shell body
14F . . . recess
15 . . . fastening portion
15B . . . recess
17 . . . shield shell
W . . . wire

The invention claimed is:

1. A shield connector, comprising:
a housing including a housing body, a fitting portion provided on the housing and to be fit into a mounting hole provided in a case of a device and a tubular portion extending outward from the housing body;
a wire extending outward from the inside of the housing through the tubular portion;
a shield conductor for surrounding the wire, an end part of the shield conductor on the housing body side being mounted on the tubular portion;
a tubular rubber boot for covering the tubular portion and a part of the wire extending outward from the tubular portion from above the shield conductor; and
a shield shell for covering the housing body and a part of the rubber boot covering the tubular portion, the rubber boot being fastened and fixed to the shield shell;
an end part of the shield conductor on the housing body side extending outward from an opening of the rubber boot on the housing body side and being sandwiched between the rubber boot and the shield shell.

2. The shield connector of claim 1, wherein the shield shell includes:
a shell for covering the housing body and a part of the rubber boot; and
a fastening portion arranged on a side opposite to the shell body across the rubber boot, the fastening portion fastening the rubber boot in cooperation with the shell body from above a folded part of the braided shield conductor.

3. The shield connector of claim 1, wherein either one of the rubber boot and the shield shell has a projection extending in a circumferential direction of the rubber boot formed on a surface in contact with the other, and the other is formed with a recess in a surface in contact with the one, the projection being fit into the recess.

* * * * *